United States Patent
Cros et al.

(10) Patent No.: US 7,969,762 B2
(45) Date of Patent: Jun. 28, 2011

(54) SPINTRONIC DEVICE WITH CONTROL BY DOMAIN WALL DISPLACEMENT INDUCED BY A CURRENT OF SPIN-POLARIZED CARRIERS

(75) Inventors: Vincent Cros, Paris (FR); Julie Grollier, Paris (FR); Manuel Munoz Sanchez, Paris (FR); Albert Fert, Paris (FR); Frederic Nguyen Van Dau, Palaiseau (FR)

(73) Assignee: Thales (FR)

( * ) Notice: Subject to any disclaimer, the term of this patent is extended or adjusted under 35 U.S.C. 154(b) by 956 days.

(21) Appl. No.: 11/721,950

(22) PCT Filed: Dec. 14, 2005

(86) PCT No.: PCT/EP2005/056786
§ 371 (c)(1),
(2), (4) Date: Jun. 15, 2007

(87) PCT Pub. No.: WO2006/064022
PCT Pub. Date: Jun. 22, 2006

(65) Prior Publication Data
US 2009/0273421 A1    Nov. 5, 2009

(30) Foreign Application Priority Data
Dec. 15, 2004   (FR) .................................. 04 13338

(51) Int. Cl.
*G11C 19/00* (2006.01)
(52) U.S. Cl. .............................. 365/80; 365/81; 365/87
(58) Field of Classification Search .................. 365/80, 365/81, 85, 87
See application file for complete search history.

(56) References Cited

U.S. PATENT DOCUMENTS

| 6,191,581 | B1 | 2/2001 | Van Dau et al. | |
| 6,291,993 | B1 | 9/2001 | Fert et al. | |
| 6,456,649 | B1 | 9/2002 | Isaksson et al. | |
| 6,496,004 | B1 | 12/2002 | Nguyen Van Dau et al. | |
| 6,693,823 | B2 * | 2/2004 | Brown | 365/158 |
| 6,906,949 | B1 * | 6/2005 | Nakamura et al. | 365/173 |
| 6,914,807 | B2 * | 7/2005 | Nakamura et al. | 365/158 |
| 7,094,480 | B2 | 8/2006 | Nguyen Van Dau et al. | |

(Continued)

FOREIGN PATENT DOCUMENTS

EP    1349172    10/2003
(Continued)

*Primary Examiner* — Alexander Sofocleous
(74) *Attorney, Agent, or Firm* — Lowe Hauptman Ham & Berner, LLP

(57) ABSTRACT

The general field of the invention is that of spintronics, namely the field of electronics using the magnetic spin properties of electrons. The main fields of application are the very large-scale magnetic storage of information and the measurement of local magnetic fields. The object of the invention is to considerably reduce the energy needed to reverse the magnetic domains of the ferromagnetic elements of submicron dimensions using the mechanism of the domain wall displacements that is induced either by just a current of spin-polarized carriers or by the combination of a current of spin-polarized carriers and a magnetic field, at least one of these being variable. This domain wall displacement results in a change of magnetic polarization in a specified switching zone. Several devices according to the invention are described that possess from one switching zone up to a plurality of switching zones according to the invention.

22 Claims, 9 Drawing Sheets

U.S. PATENT DOCUMENTS

| | | | |
|---|---|---|---|
| 7,236,386 B2 * | 6/2007 | Parkin | 365/80 |
| 7,259,437 B2 | 8/2007 | Nguyen Van Dau | |
| 7,332,781 B2 * | 2/2008 | Nozieres et al. | 257/422 |
| 7,459,998 B2 | 12/2008 | Nguyen Van Dau et al. | |
| 2004/0252538 A1 * | 12/2004 | Parkin | 365/80 |
| 2010/0118583 A1 * | 5/2010 | Hung et al. | 365/80 |

FOREIGN PATENT DOCUMENTS

| | | |
|---|---|---|
| EP | 1349184 | 10/2003 |
| EP | 1430484 | 6/2004 |

* cited by examiner

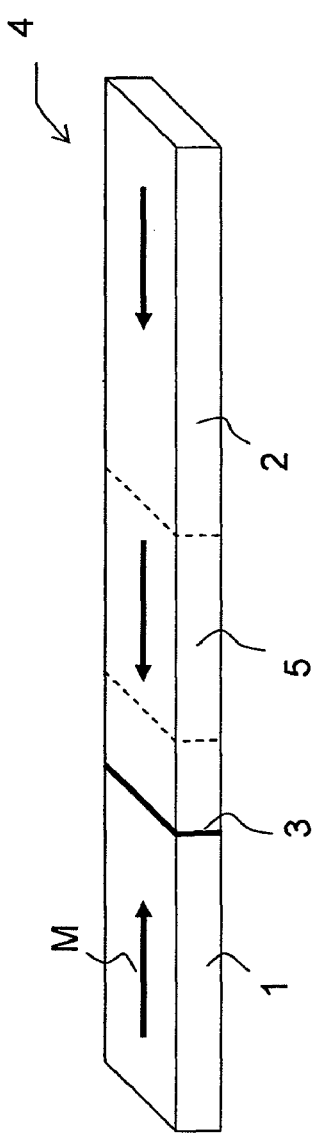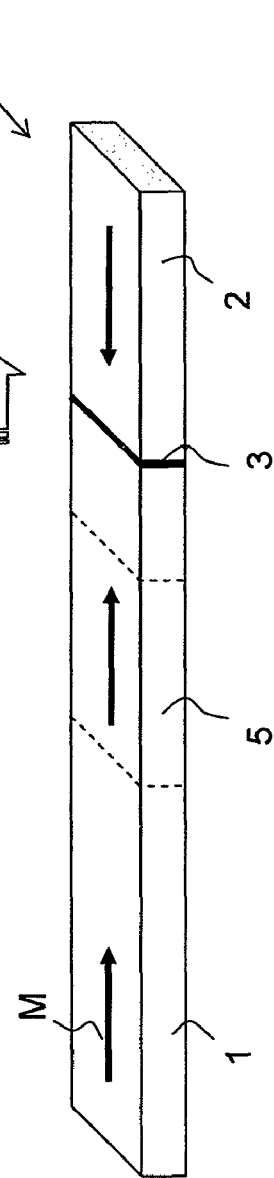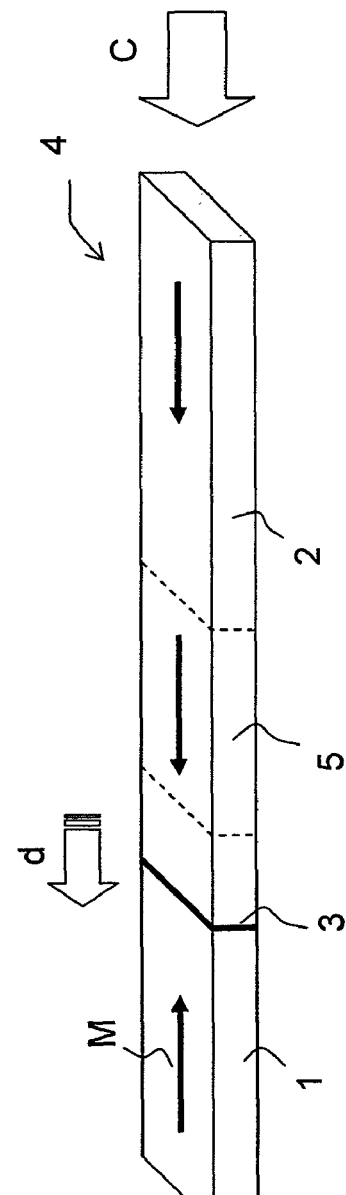

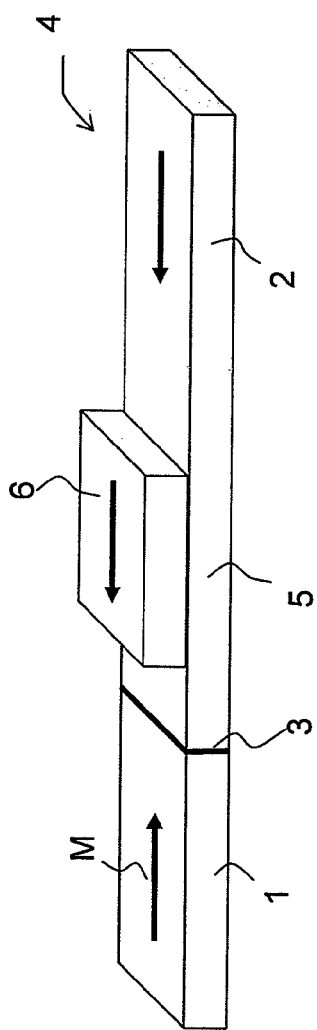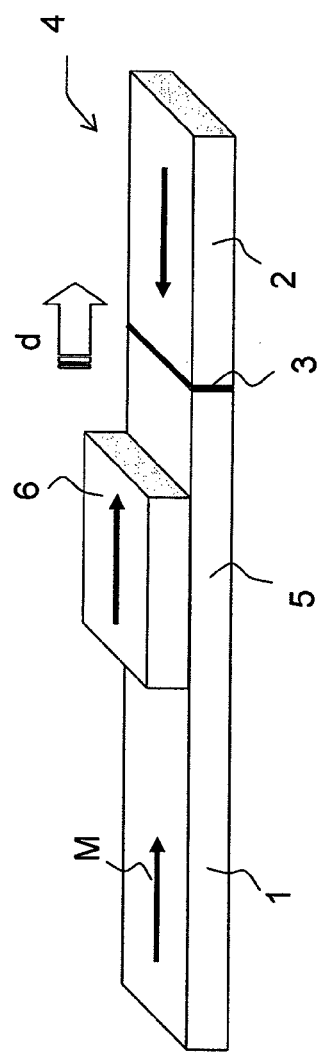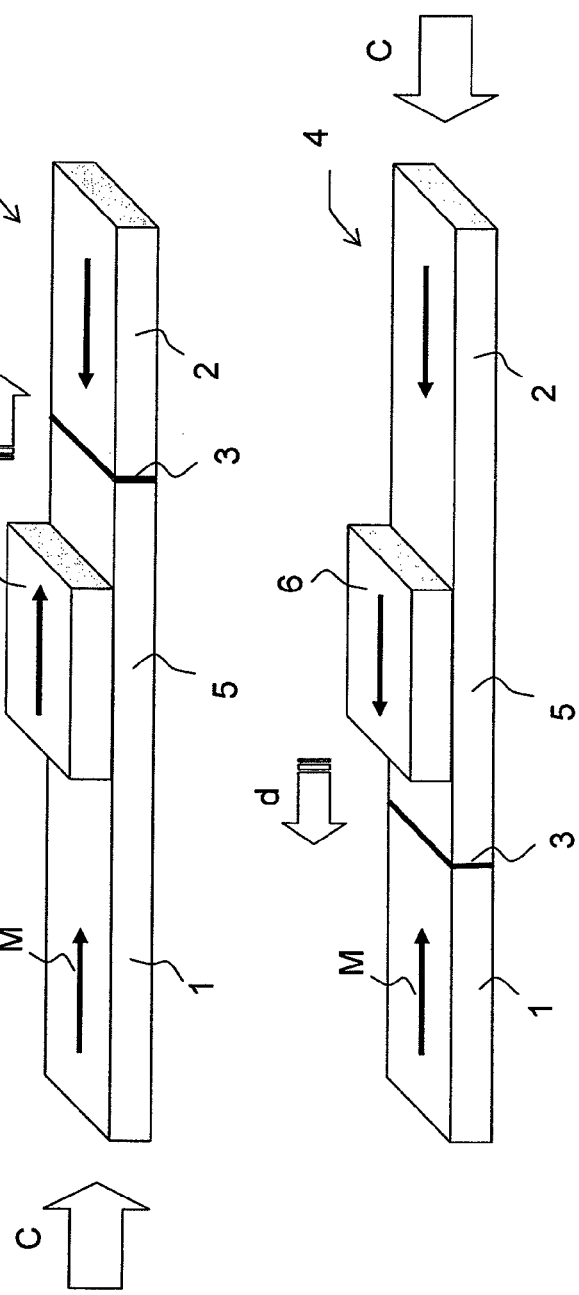

SPINTRONIC DEVICE WITH CONTROL BY DOMAIN WALL DISPLACEMENT INDUCED BY A CURRENT OF SPIN-POLARIZED CARRIERS

CROSS REFERENCE TO RELATED APPLICATIONS

The present application is based on International Application No. PCT/EP2005/056786, filed on Dec. 14, 2005, which in turn corresponds to France Application No. 0413338 filed on Dec. 15, 2004, and priority is hereby claimed under 35 USC §119 based on these applications. Each of these applications are hereby incorporated by reference in their entirety into the present application.

FIELD OF THE INVENTION

The general field of the invention is that of spintronics, namely the field of electronics using the magnetic spin properties of electrons. The main fields of application are the very large-scale magnetic storage of information and the measurement of local magnetic fields.

BACKGROUND OF THE INVENTION

Recent developments in nanolithography techniques make it possible to produce submicron-scale spintronic devices based on magnetic nanostructures, such as spin valves, magnetic tunnel junctions and heterostructures based on magnetic semiconductors. Precise control of the magnetic configuration of such objects, such as the direction of magnetization or the structure of the magnetic domains, is one of the major technological challenges in the development of miniaturized spintronic devices.

Conventionally, the micromagnetic structure of a ferromagnetic element is composed of domains in which the magnetic moments are all aligned in the same direction, the domains being separated from one another by domain walls within which the magnetic moments gradually rotate. Thus, FIG. 1 shows a magnetic domain wall 3 separating two adjacent domains 1 and 2. The magnetic moments M are represented by arrows in bold. For the sake of clarity, the magnetic moments of the first domain are oriented in the opposite direction to the magnetic moments of the second domain in this figure. Of course, the magnetic moments of two domains may have different orientations. Within the domain wall, the orientation of the magnetic moments varies progressively, thus passing from the orientation of the first domain to that of the second domain. When a sufficiently high magnetic field is applied, the magnetic element no longer contains domain walls, and is called a one-domain element. To reverse the total magnetization, the direction of the applied magnetic field is reversed and the reversal of the magnetization then takes place by the nucleation and propagation of magnetic domain walls within the ferromagnetic element. In current devices, the external magnetic field is generated by a current flowing along lines close to the element. Controlled reversal of the magnetization of a ferromagnetic element used in spintronics corresponds for example to the writing of a magnetic bit.

The size of the domains and the number of magnetic domain walls present in the magnetic element depend on the dimensions of the ferromagnetic element. When the size of the ferromagnetic element decreases, it then becomes necessary to apply a more intense magnetic field for changing the magnetic domain walls. This phenomenon is particularly sensitive when the dimensions of the element are of the order of a few nanometers. Consequently, miniaturization within the nanoscale range of the magnetic bits obtained from ferromagnetic elements results in a large increase in the number of reversing magnetic fields necessary and consequently leads to an increasingly unacceptable consumption of energy for proper operation of the spintronic device. This phenomenon consequently limits the electronic storage capabilities associated with this technology.

SUMMARY OF THE INVENTION

The object of the invention is to achieve magnetic moment reversal using the mechanism of domain wall displacement induced either completely or partly by a spin current. The advantages are, firstly, a reduction in the necessary energy and secondly, in the case of matrix integration of the spintronic devices driven by control rows and columns, a reduction in undesirable crosstalk phenomena. For appropriate structures, it is possible to achieve magnetization reversal by involving only the propagation of a single domain wall under the effect of a spin current. Thanks to this principle, the energies needed for implementation are then markedly lower than those for techniques using just the generation of magnetic fields.

More precisely, the subject of the invention is a spintronic device comprising at least one first ferromagnetic structure comprising a first magnetic switching zone, said structure comprising at least one first magnetic domain in which the magnetic moments are all aligned in a first direction and at least one second magnetic domain in which the magnetic moments are all aligned in a second direction different than the first direction, the first domain being separated from the second domain by a magnetic domain wall, characterized in that:

said structure includes means for stabilizing said magnetic domain wall in two stable positions, the first switching zone being located between these two stable positions, said domain wall being able to move from the first stable position to the second stable position at least due to the effect of a first current C of spin-polarized carriers passing through said structure, and said switching zone thus belonging either to the first magnetic domain or to the second magnetic domain; and the device includes at least one first magnetic element, the magnetic moments of said first magnetic element not being coupled with the magnetic moments of the first magnetic switching zone.

Advantageously, at least one second magnetic element is placed between the first switching zone and the first magnetic element in such a way that the magnetic moments of said second element are coupled with the magnetic moments of said switching zone, whether said switching zone belongs to the first magnetic domain or to the second magnetic domain.

Advantageously, the device also includes at least one first separating layer placed between the second magnetic element and the first magnetic element.

Advantageously, the separating layer is made of a nonmagnetic material.

Advantageously, the displacement is obtained by the combined effect of the spin current and a magnetic field, the field lines of which pass through the magnetic switching zone so as to be approximately parallel to the direction of the current, at least the current or the magnetic field being variable. The device then includes a conducting line placed beneath the magnetic switching zone and approximately perpendicular to the direction of the spin current, a second current passing through said line so as to generate the magnetic field in the magnetic switching zone.

Advantageously, the current lies above a certain threshold value sufficient to cause displacement of the domain wall from the first stable position to the second stable position, said switching zone thus belonging either to the first magnetic domain or to the second magnetic domain.

Advantageously, the device includes a second ferromagnetic structure comprising a second magnetic switching zone facing the first switching zone of the first ferromagnetic structure, said second structure including at least one third magnetic domain in which the magnetic moments are all aligned in a third direction and a fourth magnetic domain in which the magnetic moments are all aligned in a fourth direction different than the third direction, the third domain being separated from the fourth domain by a second magnetic domain wall, said second structure also including means for stabilizing said magnetic domain wall in third and fourth stable positions, the second switching zone lying between these two stable positions, it being possible for said second domain wall to move from the third stable position to the fourth stable position under the effect of a second spin-carrier current passing through said second structure, said second current being above a certain threshold value, the second switching zone thus belonging either to the third magnetic domain or to the fourth magnetic domain, said second switching zone of said second structure being separated from the first switching zone of the first ferromagnetic structure by at least one separating layer.

Each threshold current is between one thousand amps per square centimeter and one million amps per square centimeter.

Advantageously, the first ferromagnetic structure or the second ferromagnetic structure are ferromagnetic strips, the widths of which are between a few nanometers and a few microns and the thicknesses of which are between a few nanometers and a few tens of nanometers. Each ferromagnetic strip may have, in each stable position, a local change of geometry, it being possible for said local change of geometry to be either a narrowing or a thinning or a widening of the ferromagnetic strip. Each ferromagnetic strip may also have, in each stable position, a local change of structure. Said local change of structure is for example obtained by oxidation.

Advantageously, the ferromagnetic structure comprises, beneath the switching zone, a combination of magnetic layers and nonmagnetic layers for concentrating the spin flux in the switching zone. In one particular embodiment, this combination comprises at least two ferromagnetic blocks lying on either side of the switching zone and separated by a first nonmagnetic layer, the combination consisting of the two blocks and the nonmagnetic layer being isolated from the ferromagnetic structure by a second nonmagnetic layer. More precisely, the ferromagnetic blocks have a width equivalent to that of the strip and a thickness greater than that of the strip, typically ten times the thickness of the strip. Advantageously, the magnetization directions of the two ferromagnetic blocks make a nonzero angle between them, typically an angle of approximately 180 degrees, the magnetizations of the two blocks thus being antiparallel. Advantageously, the second nonmagnetic layer has a thickness of a few nanometers and the material of the nonmagnetic layers is gold.

Advantageously, the spin-polarized carriers are either electrons or holes.

It is also possible to produce electronic memories of matrix structure comprising several spintronic devices of this type.

BRIEF DESCRIPTION OF THE DRAWING

The invention will be more clearly understood and other advantages will become apparent on reading the following description given by way of nonlimiting example and thanks to the appended figures in which:

FIGS. 4a, 4b and 4c show the principle of change of magnetic domain by domain wall displacement;

FIGS. 5a, 5b and 5c show a first embodiment variant according to this principle;

DETAILED DESCRIPTION OF THE DRAWING

As mentioned, the physical principle at the core of the invention is based on the mechanism of domain wall displacement induced either partly or completely by a spin current. The physical mechanism at the origin of domain wall displacement induced by a spin-polarized current is called spin transfer.

Figure 3:
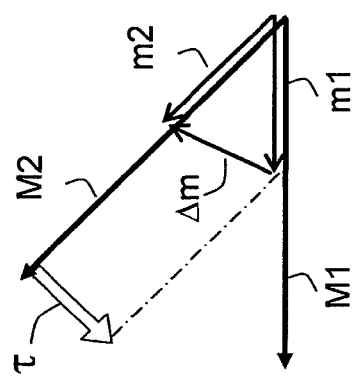
FIG. 3 shows the variations of the orientation of the spins carried by the current and of the magnetic moments within the magnetic domain walls.
Figure 1:
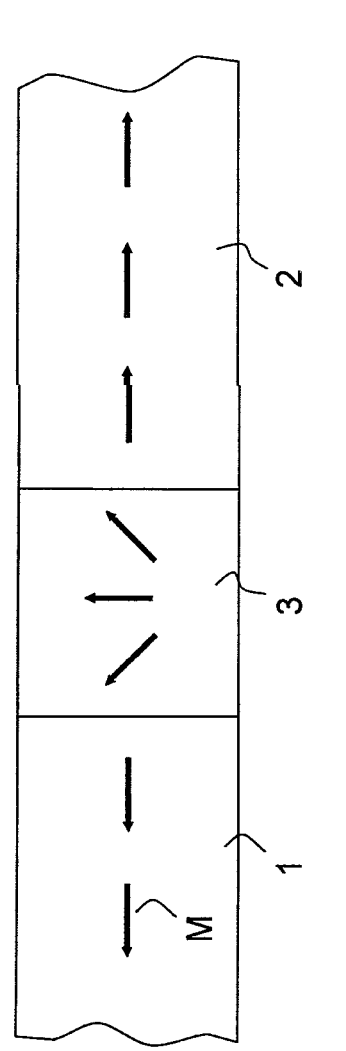
FIG. 1 shows a simplified diagram of a magnetic domain wall separating two magnetic domains.
Figure 2:
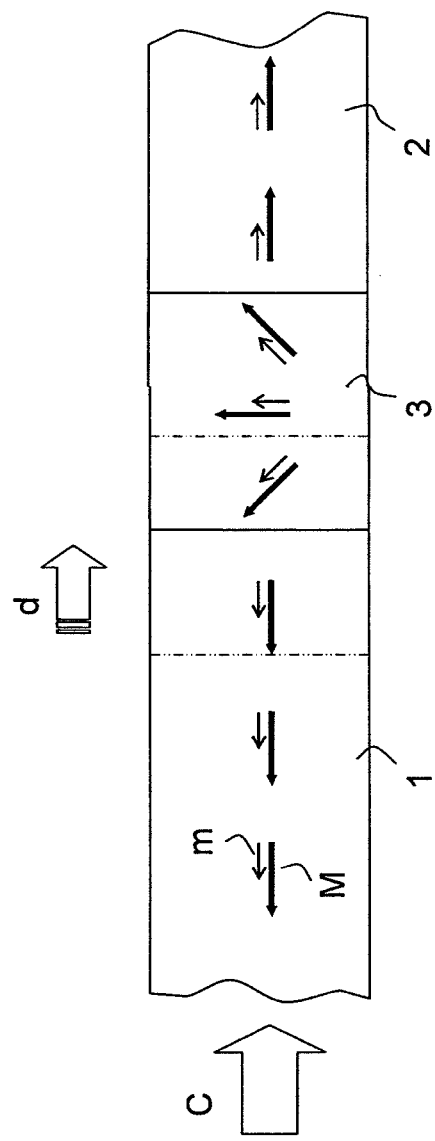
FIG. 2 shows the displacement of said domain wall when it is subjected to a spin-polarized current.

FIGS. 2 and 3 illustrate this mechanism. FIG. 2 shows a magnetic domain wall 3 separating two adjacent domains 1 and 2. The magnetic moments M are represented by arrows in bold. The magnetic moments of the first domain are oriented in the opposite direction to the magnetic moments of the second domain in this figure. Of course, the magnetic moments of two domains may have different orientations. Within the domain wall 3, the orientation of the magnetic moments varies progressively, thus passing from the orientation of the first domain to that of the second domain. When a current C of electronic carriers, represented by the white arrow, flows in the domains, the spin m represented by a thin arrow of the electronic carriers is aligned with the magnetic moment of the material. These carriers may either be electrons or holes. When these carriers enter the magnetic domain wall, the spins of said carriers are no longer aligned with the local moments of the domain wall. FIG. 3 thus shows the variation of the magnetic moment at two neighboring points in the magnetic domain wall, the magnetic moments at these two points being denoted by M1 and M2. When the carrier passes from one point to the other, its spin m1 is aligned by an exchange mechanism with the direction of the magnetic moment M2. This exchange mechanism is shown symbolically in FIG. 3 by a vector Δm and the spin m1 becomes m2 but, in return, this spin m1 exerts a torque τ shown symbolically by the white arrow in FIG. 3 on the moment M2 of the domain wall, which tends to rotate it toward the direction of the initial magnetic moment M1. This rotation of the moments within the domain wall results in a displacement d of the domain wall in the direction of propagation of the electrons. This displacement is shown symbolically by a striped arrow in FIG. 2. The initial position of the domain wall is represented by dotted lines. This propagation consequently depends on the direction of the current. However, domain wall displacement occurs only if the current densities are high enough. In general, the threshold current is between one thousand amps per square centimeter and one million amps per square centimeter. Owing to the small dimensions of the spintronic devices, a current of a few milliamps is sufficient to obtain the desired domain wall displacement. This mechanism makes it possible to locally reverse a magnetization by domain wall displacement without applying a large external magnetic field.

FIGS. 4a, 4b and 4c show an elementary spintronic device employing this principle. It comprises a first ferromagnetic structure 4 comprising a first magnetic switching zone 5. Said structure includes at least one first magnetic domain 1 in which the magnetic moments M are all aligned in a first direction and a second magnetic domain 2 in which the magnetic moments are all aligned in a second direction different than the first direction, the first domain being separated from the second domain by a magnetic domain wall 3 shown by the solid lines in the figures, said structure also including means (not shown in the figures) for stabilizing said magnetic domain wall in two stable positions. The first switching zone 5 bounded by two dotted lines in FIG. 4a is located between these two stable positions. Said domain wall may move from the first stable position to the second stable position due to the effect of a spin current C passing through said structure. Reciprocally, when the current C is reversed, the domain wall moves from the second stable position so as to assume the first stable position. The displacements d of the domain walls are shown in FIGS. 4b and 4c according to the direction of the current C. Said current is above the threshold value allowing the domain wall displacement. Thus, as may be seen in FIGS. 4b and 4c, the switching zone belongs either to the first magnetic domain 1 or to the second magnetic domain 2, depending on the position of the domain wall 3. Thus, a spintronic device capable of storing for example one magnetic bit is very simply created.

In general, the magnetic structure 4 is in the form of a strip or bar. The thickness of the bar is between a few nanometers and a few tens of nanometers. It may consist of a single thin film of magnetic material or of a more complex structure consisting of several magnetic or nonmagnetic films. The lateral dimensions of the bar are between a few nanometers and a few microns aside. Of course, depending on the envisaged use, various strip shapes are possible. Depending on the materials and the geometric configuration, the speed of propagation ranges from the order of a few nanometers per nanosecond to a few microns per nanosecond. It is therefore possible to switch several magnetic gigabits per second with this technique.

FIGS. 5a to 5c show an embodiment variant of the basic arrangement described above. As illustrated in FIG. 5a, a magnetic element 6 has been placed on the previous switching zone 5. There is therefore strong direct magnetic coupling between the bar 4 and the magnetic element 6. When the magnetization in the switching zone 5 of the bar 4 lying beneath the element 6 reverses during propagation of a domain wall, the magnetization in the element 6 will be instantly reversed, as illustrated in FIGS. 5b and 5c in which the magnetization M in the element shown symbolically by a wide white arrow changes direction when the magnetic domain wall passes from one stable position to the other, depending on the direction of the current flowing through said domain wall. Thus, the magnetization in the element is reproducibly switched between two directions of magnetization that can be identified as logic states "0" and "1".

The magnetic element 6 may or may not be made of the same material as the bar in which the domain wall moves under the influence of the current. The thickness of the element lies between a few atomic planes and a few tens of nanometers.

In the embodiments described above, the element to be switched is a single magnetic object defining a magnetic bit.

In the devices according to the invention, this magnetic element which can be controlled by domain wall displacement forms part of a more complex structure such as a magnetic tunnel junction, a spin valve or any other elementary spintronic device. As an example, FIGS. 6a, 6b and 7 show structures of the spin valve or magnetic tunnel junction type according to the invention.

Figure 6A:
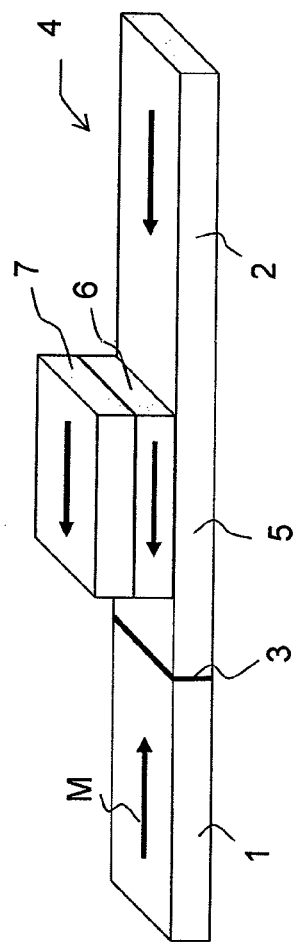
FIGS. 6a and 6b show the diagram of a device according to the invention.
Figure 6B:
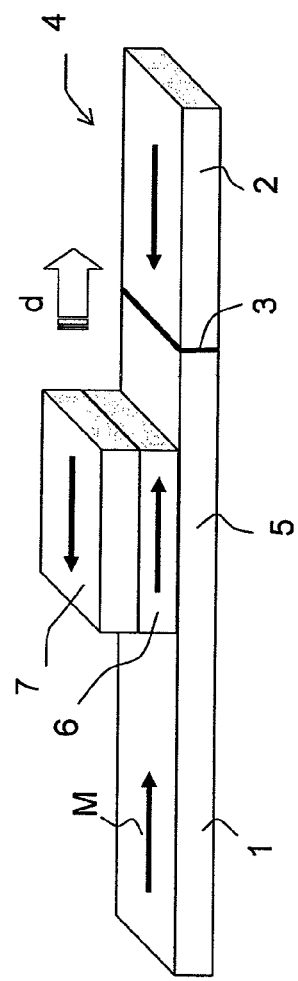

The structure in FIGS. 6a and 6b comprises a ferromagnetic bar 4 comprising a switching zone 5, a first magnetic element 7 and finally a second magnetic element 6 placed between the switching zone and the first magnetic element 7.

The second magnetic element 6 is controlled by the displacement of a domain wall 3 separating two magnetic domains 1 and 2 of the ferromagnetic bar 4. The direction of magnetization of the first magnetic element 7 is not modified by the displacement of the domain wall in the bar, as indicated in FIG. 6b in which the displacement of the domain wall under the effect of a carrier current causes the magnetic moments of the second element to switch without changing the orientation of the magnetic moments of the first element 7. The magnetic configuration of the entire device may be probed either by a local magnetooptic measurement or else by a magnetoresistive measurement by making an electrical contact on top of the first element and by measuring the resistance between this contact and the magnetic bar. The second element has the same geometric characteristics as the first magnetic element. In FIGS. 6a and 6b, to simplify the drawing, the first magnetic element 7 is composed of a single film produced in a single magnetic material. It may also have a more complex structure comprising several films of different materials, including for example a ferromagnetic layer and an antiferromagnetic layer.

Figure 7:
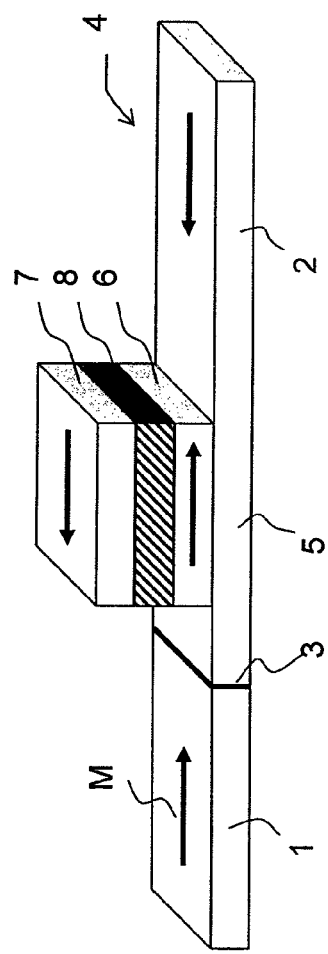
FIG. 7 shows a first embodiment variant according to the invention.

The structure of FIG. 7 is a variant of the previous structure. It comprises a ferromagnetic bar 4, a second magnetic element 6, a first separating layer 8 and finally a first magnetic element 7 placed on said separating layer and having the same properties as the magnetic element 7 of FIGS. 6a and 6b.

The second magnetic element 6 is controlled by the displacement of a domain wall 3 separating two magnetic domains 1 and 2 of the ferromagnetic bar 4. It is separated from the first magnetic element by the separating layer 8. This layer 8 is made of a material that may be a nonmagnetic conducting material or an insulator. If the material is nonmagnetic, it may be a metal or a semiconductor. The direction of magnetization of the first magnetic element is not modified by the displacement of the domain wall in the bar. The magnetic configuration of the entire device may be probed by the means described above. The separating layer 8 has a thickness between a few atomic planes and a few nanometers. The lateral dimensions of the separating layer 8 and of the first element 7 are equivalent to those of the second magnetic element 6.

Figure 8:
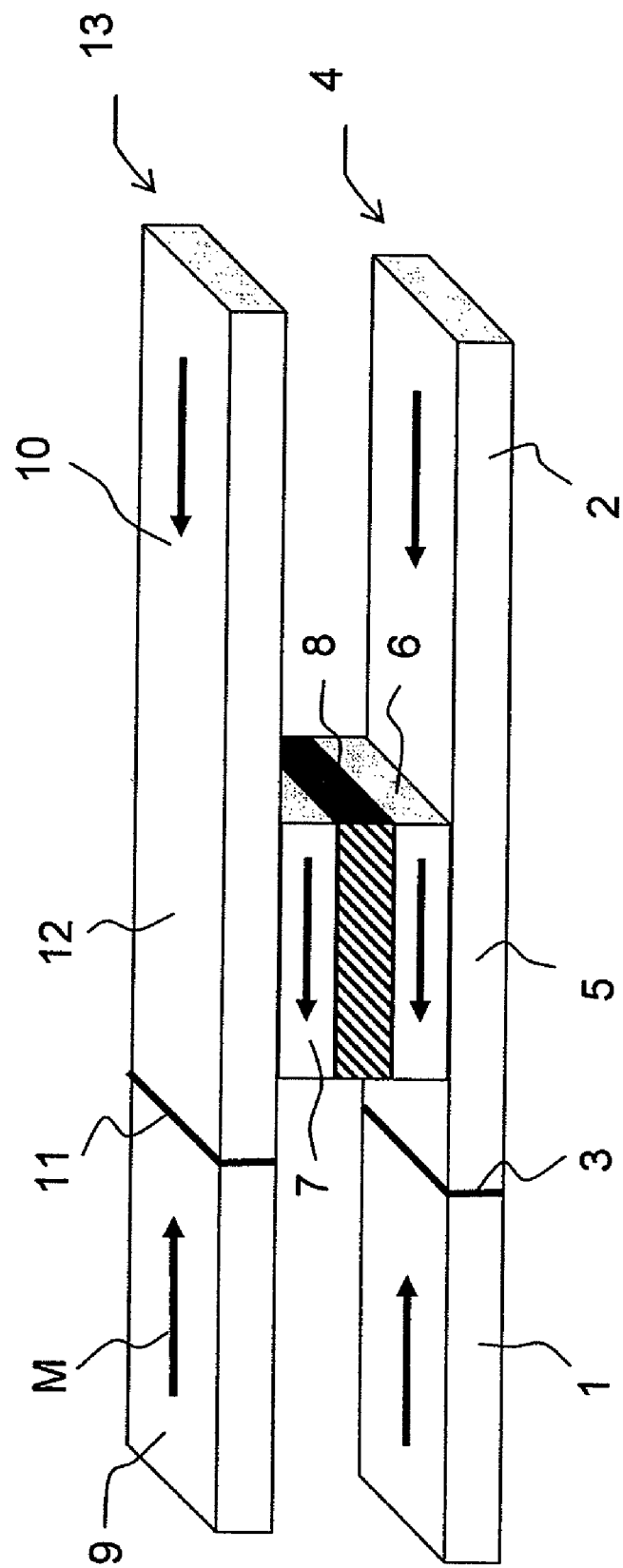
FIG. 8 shows a second embodiment variant according to the invention.

The structure of FIG. 8 represents a dual-magnetic-control device. It comprises, in succession, a first ferromagnetic bar 4, comprising two magnetic domains 1 and 2 separated by a domain wall 3 and including a first switching zone 5, then a second magnetic element 6, a separating layer 8, a first magnetic element 7 and finally a second ferromagnetic bar 13, also comprising two magnetic domains 9 and 10 separated by a second domain wall 11 and including a second switching zone 12. The separating layer 8 isolates the magnetic state of the second magnetic element 6 from the magnetic state of the first magnetic element 7. It is thus possible to obtain a device having several possible magnetic states depending on the direction of the currents applied in the first ferromagnetic bar 4 or the second ferromagnetic bar 13.

Of course, other variants of devices using the basic principle of magnetic switching by domain wall displacement induced by a spin current are also possible.

Figure 9:
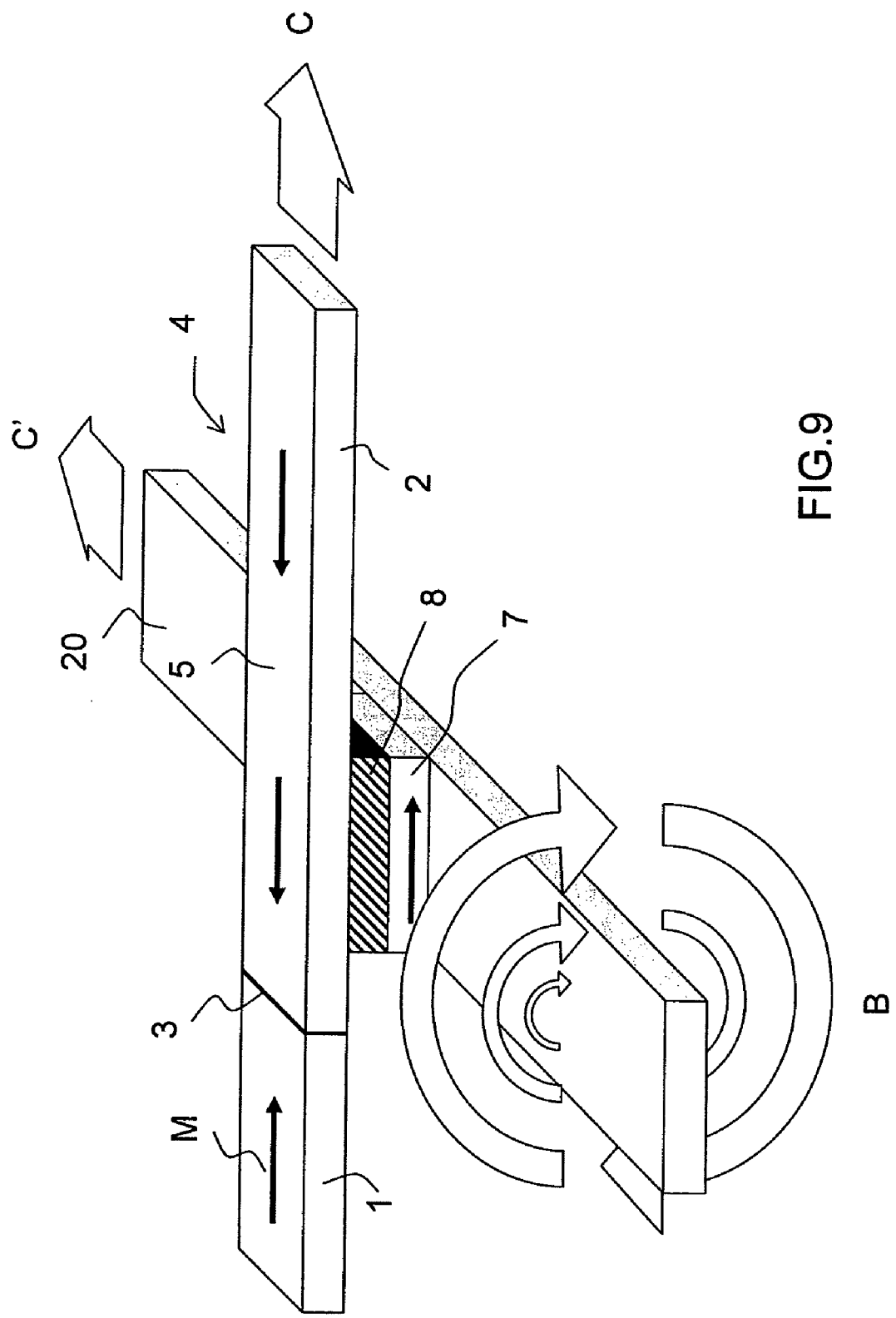
FIG. 9 shows the principle of change in magnetic domain when a current and a magnetic field are applied.

As was seen above, it is possible by means of the spin current alone to switch by displacement of the domain wall. However, for some applications, the use of the spin current alone may have drawbacks. Firstly, the threshold value of the current needed to displace the domain wall may be high. Secondly, this principle does not allow a simple way of producing matrix control, for example for addressing a memory made up of a matrix of spintronic devices, in particular when the number of matrix elements is high. It is also advantageous to obtain the displacement by the combined effect of the spin current and of a magnetic field, the field lines of which pass through the magnetic switching zone approximately parallel to the direction of the spin current, at least the spin current or the magnetic field being variable. Thus, by injecting a spin current low enough not to induce domain wall displacement but high enough for the injection of a weak magnetic field to cause domain wall displacement, a domain wall displacement control is obtained that does not have the above drawbacks. As indicated in FIG. 9, the ferromagnetic structure 4 then includes a conducting line 20 placed beneath the magnetic switching zone 5 and approximately perpendicular to the direction of the spin current C, a second current C' passing through said line so as to generate a magnetic field B having field lines parallel to the direction of the current C in the magnetic switching zone. In FIG. 9, the field lines are indicated by broad semicircular concentric arrows and the currents by broad arrows. In the example shown in FIG. 9, a magnetic element 7 and an insulating layer 8 are interposed in succession between the conducting line 20 and the switching zone. Of course, other arrangements are possible. It has been demonstrated that it is thus possible to gain a factor of 10 in the magnetic fields needed to displace the domain walls.

Figure 10:
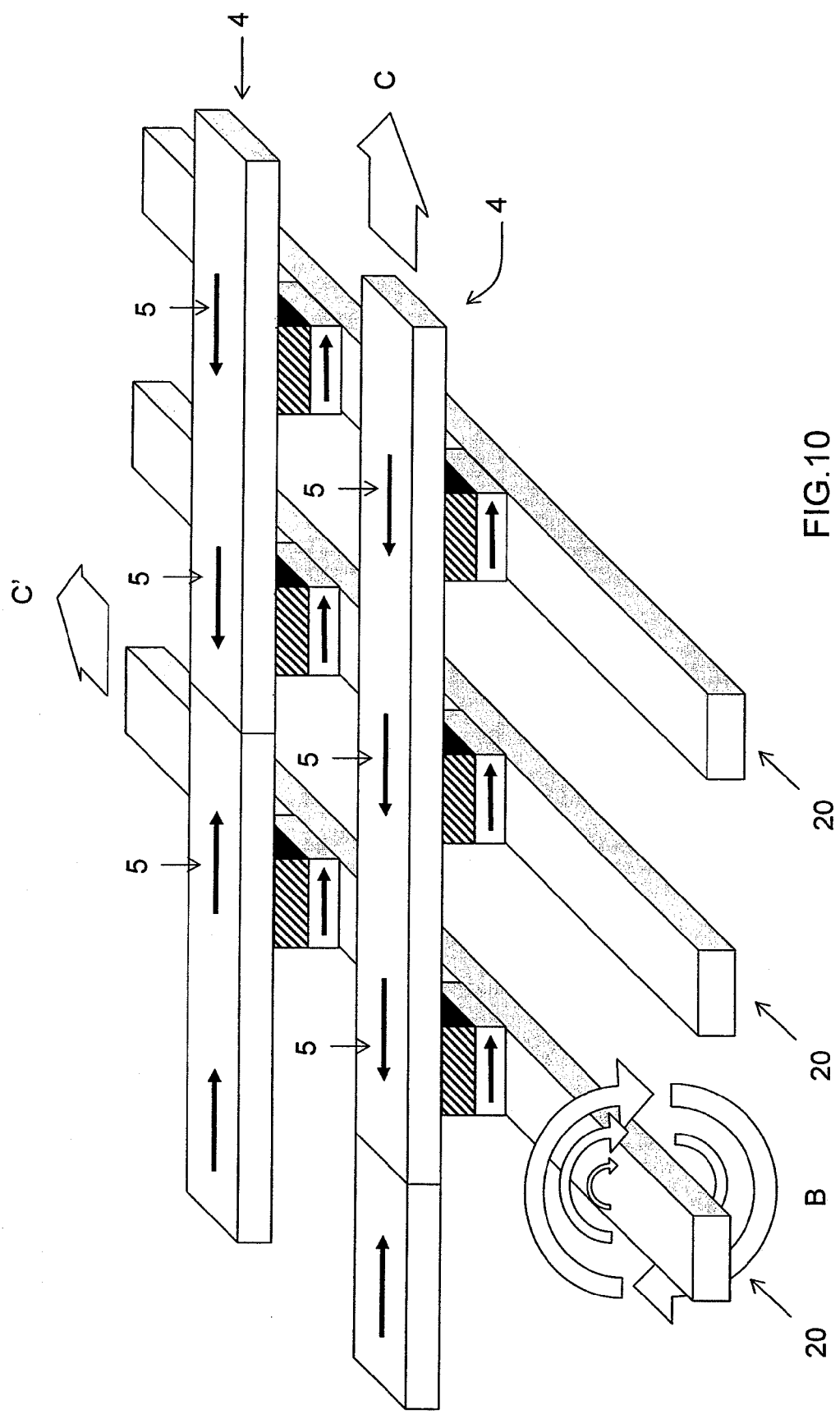
FIG. 10 shows the principle of a matrix digital memory comprising a device according to the invention.

In this case, it is possible to produce electronic memories of matrix structure comprising at least one spintronic device of this type. As an example, the matrix shown in FIG. 10 comprises a plurality of rows comprising ferromagnetic structures 4 arranged in series and a plurality of control columns 20 perpendicular to the rows, which are placed beneath them. The magnetic switching zones are located at the intersections of the rows and control columns. It is therefore possible to address one particular ferromagnetic switching zone by controlling the row and the corresponding column.

The physical phenomenon of spin transfer between the charges that ensure conduction and the magnetic moments in the domain wall resulting in the movement of the domain wall make it possible to initiate the movement of the domain wall above a certain critical current. Next, the domain wall is pushed by the flux of spin-polarized carriers. It is therefore necessary to prepare the magnetic configuration of the ferromagnetic structure so that the magnetic domain wall remains trapped between two stable positions. To do this, it is necessary to create magnetic potential traps in each stable position. This may be achieved by applying a localized external magnetic field. These domain wall stability positions may also be obtained by creating or using defects in the bar which allow the domain wall to be trapped—these defects may be of a structural or geometric kind.

Figure 11:
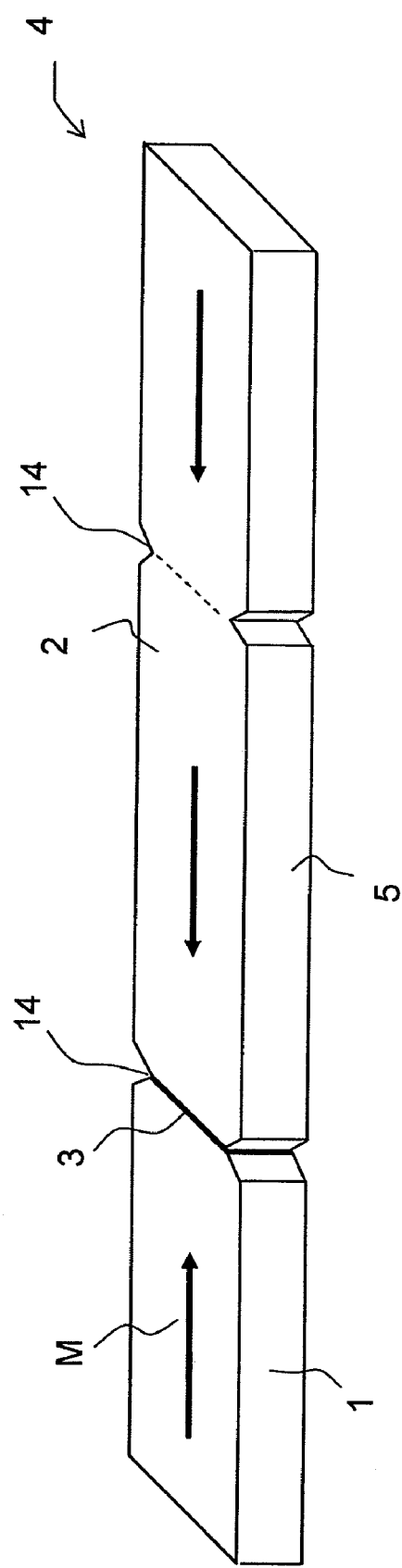
FIG. 11 shows one possible embodiment of a means for stabilizing the magnetic domain walls.

As a nonlimiting example, FIG. 11 shows a geometric configuration of the ferromagnetic bar 4 in which two narrowings 14 lying on either side of the switching zone 5 make it possible to stabilize or trap the domain wall 3 separating the first domain 1 from the second domain 2 at said narrowings. In this case, under the effect of a current of spin carriers, the domain wall 3 can move from one narrowing 14 to the other. Of course, the shape and the position of the narrowings are not limited to those shown in FIG. 9. Any other type of geometrical modification of the shape of the bar may be envisaged, such as for example an unsymmetrical narrowing of its width, an enlargement of its width, or a thinning of its thickness. It is also possible for the structure to be locally modified by a chemical process, such as oxidation.

The threshold currents allowing domain wall displacement, either just under the action of a spin-polarized current or else under the combined action of a spin-polarized current and a magnetic field, are generally high. To reduce the threshold currents, a combination of magnetic and nonmagnetic layers is added beneath the switching zone 5 in which the domain wall 3 moves between the magnetic domains 1 and 2, which layers allow the spin flux to be concentrated in the switching zone.

Figure 12:
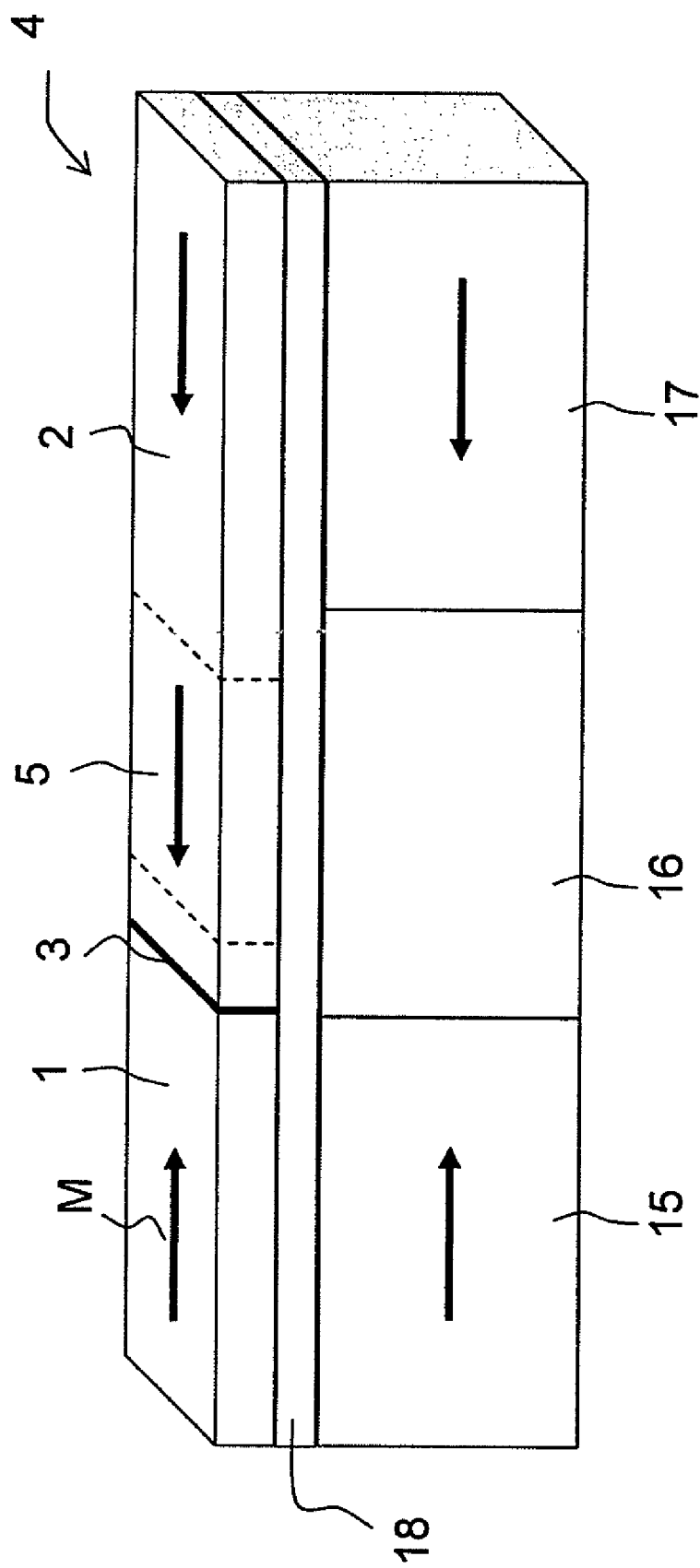
FIG. 12 shows an embodiment of the device for reducing the value of the threshold currents.

As an example, a structure of the device according to this embodiment is shown in FIG. 12. This comprises, beneath a strip-shaped ferromagnetic structure 4 that includes the switching zone 5, two ferromagnetic blocks 15 and 17 lying on either side of the switching zone 5 and separated by a nonmagnetic, for example gold, layer 16. These blocks 15 and 17 have a width equivalent to that of the strip and a thickness greater than that of the strip, typically ten times the thickness of the strip. The layer 16 has a length of between a few nanometers and a few microns. The magnetizations in the two ferromagnetic blocks 15 and 17 are not aligned so as to be parallel in order to obtain the threshold current reduction effect, the most favorable case being the antiparallel alignment of the magnetizations in the two ferromagnetic blocks, shown in FIG. 12 in which the magnetic moments are represented by bold arrows pointing in opposite directions. The combination, consisting of the blocks and the gold layer, is isolated from the strip by a nonmagnetic layer 18, which must be as thin as possible, typically having a thickness of a few nanometers. This arrangement makes it possible to reduce the threshold currents by a substantial factor, of at least 5.

The invention claimed is:

1. A spintronic device, comprising:
   a first ferromagnetic structure including a first magnetic switching zone, said first ferromagnetic structure comprising at least one first magnetic domain in which the magnetic moments M are all aligned in a first direction and a second magnetic domain in which the magnetic moments are all aligned in a second direction different than the first direction, the first magnetic domain being separated from the second magnetic domain by a first magnetic domain wall,
   said first ferromagnetic structure including means for stabilizing said first magnetic domain wall in two stable positions, the first magnetic switching zone being located between these two stable positions, said first magnetic domain wall being able to move from the first stable position to the second stable position by the combined effect of a first current of spin-polarized carriers passing through said first ferromagnetic structure and a magnetic field, the field lines of which pass through the first magnetic switching zone so as to be approximately parallel to the direction of the first current, at least the first current or the magnetic field being variable and said first magnetic switching zone thus belonging either to the first magnetic domain or to the second magnetic domain; and the spintronic device including a first magnetic element, the magnetic moments of said first magnetic element not being coupled with the magnetic moments of the first magnetic switching zone.

2. The spintronic device as claimed in claim 1, wherein at least one second magnetic element is placed between the first magnetic switching zone and the first magnetic element in such a way that the magnetic moments of said second magnetic element are coupled with the magnetic moments of said first magnetic switching zone, whether said first magnetic switching zone belongs to the first magnetic domain or to the second magnetic domain.

3. The spintronic device as claimed in claim 1, including at least one first separating layer placed between the first magnetic element and the first magnetic switching zone.

4. The spintronic device as claimed in claim 3, wherein the separating layer is made of a nonmagnetic material.

5. The spintronic device as claimed in claim 1, including a conducting line placed beneath the first magnetic switching zone and approximately perpendicular to the direction of the first current, a second current passing through said line so as to generate the magnetic field in the first magnetic switching zone.

6. The spintronic device as claimed in claim 1, wherein the first current lies above a certain threshold value sufficient to cause displacement of the first magnetic domain wall from the first stable position to the second stable position, said first magnetic switching zone thus belonging either to the first magnetic domain or to the second magnetic domain.

7. The spintronic device as claimed in claim 6, including a second ferromagnetic structure comprising a second magnetic switching zone facing the first magnetic switching zone of the first ferromagnetic structure, said second ferromagnetic structure including at least one third magnetic domain in which the magnetic moments are all aligned in a third direction and a fourth magnetic domain in which the magnetic moments are all aligned in a fourth direction different than the third direction, the third magnetic domain being separated from the fourth magnetic domain by a second magnetic domain wall, said second ferromagnetic structure also including means for stabilizing said second magnetic domain wall in third and fourth stable positions, the second magnetic switching zone lying between the third and fourth stable positions, it being possible for said second magnetic domain wall to move from the third stable position to the fourth stable position under the effect of a second spin-carrier current passing through said second ferromagnetic structure, said second spin-carrier current being above a certain threshold value, the second magnetic switching zone thus belonging either to the third magnetic domain or to the fourth magnetic domain, said second magnetic switching zone of said second ferromagnetic structure being separated from the first magnetic switching zone of the first ferromagnetic structure by at least one separating layer.

8. The spintronic device as claimed in claim 7, wherein each of the first and second current is between one thousand amps per square centimeter and one million amps per square centimeter.

9. The spintronic device as claimed in claim 7, wherein the first ferromagnetic structure or the second ferromagnetic structure are ferromagnetic strips, the widths of which are between a few nanometers and a few microns and the thicknesses of which are between a few nanometers and a few tens of nanometers.

10. The spintronic device as claimed in claim 9, wherein each ferromagnetic strip has, in each stable position, a local change of geometry.

11. The spintronic device as claimed in claim 10, wherein the local change of geometry is either a narrowing, or a thinning or a widening of the ferromagnetic strip.

12. The spintronic device as claimed in claim 11, wherein each ferromagnetic strip has, in each stable position, a local change of structure.

13. The spintronic device as claimed in claim 12, wherein the local change of structure is obtained by oxidation.

14. The spintronic device as claimed in claim 1, wherein the first ferromagnetic structure comprises, beneath the first magnetic switching zone, a combination of magnetic layers and nonmagnetic layers for concentrating spin flux in the first magnetic switching zone.

15. The spintronic device as claimed in claim 14, wherein the combination comprises at least two ferromagnetic blocks lying on either side of the first magnetic switching zone and separated by a first nonmagnetic layer, the combination consisting of the two ferromagnetic blocks and the first nonmagnetic layer being isolated from the first ferromagnetic structure by a second nonmagnetic layer.

16. The spintronic device as claimed in claim 14, wherein the ferromagnetic blocks have a width equivalent to that of the strip and a thickness greater than that of the strip, typically ten times the thickness of the strip.

17. The spintronic device as claimed in claim 15, wherein the magnetization directions of the two ferromagnetic blocks make a nonzero angle between them.

18. The spintronic device as claimed in claim 15, wherein the magnetization directions of the two ferromagnetic blocks make an angle of approximately 180 degrees between them, the magnetizations of the two blocks thus being antiparallel.

19. The spintronic device as claimed in claim 15, wherein the second nonmagnetic layer has a thickness of a few nanometers.

20. The spintronic device as claimed in claim 19, wherein the material of the nonmagnetic layers is gold.

21. The spintronic device as claimed in claim 1, wherein the spin-polarized carriers are either electrons or holes.

22. An electronic memory of matrix structure, comprising at least one spintronic device as claimed in claim 1.

* * * * *